US012731631B2

(12) United States Patent
Lee et al.

(10) Patent No.: US 12,731,631 B2

(45) Date of Patent: Sep. 8, 2026

(54) MEMORY DEVICE AND METHOD OF OPERATING THE SAME

(71) Applicant: Samsung Electronics Co., Ltd., Suwon-si (KR)

(72) Inventors: Yunsoo Lee, Suwon-si (KR); Hundae Choi, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 116 days.

(21) Appl. No.: 18/937,180

(22) Filed: Nov. 5, 2024

(65) Prior Publication Data

US 2025/0239294 A1 Jul. 24, 2025

(30) Foreign Application Priority Data

Jan. 24, 2024 (KR) ........................ 10-2024-0010996

(51) Int. Cl.

*G11C 11/4076* (2006.01)
*G11C 11/4093* (2006.01)
*G11C 11/4096* (2006.01)
*G11C 11/408* (2006.01)

(52) U.S. Cl.

CPC ...... *G11C 11/4076* (2013.01); *G11C 11/4093* (2013.01); *G11C 11/4096* (2013.01); *G11C 11/4082* (2013.01)

(58) Field of Classification Search

CPC ............ G11C 11/4076; G11C 11/4082; G11C 11/4093; G11C 11/4096
USPC ...................................................... 365/233.1
See application file for complete search history.

(56) References Cited

U.S. PATENT DOCUMENTS 5,521,878 A * 5/1996 Ohtani ................. G11C 7/1051 365/189.05
6,240,048 B1 5/2001 Matsubara
7,149,841 B2 12/2006 Laberge
7,580,318 B2 8/2009 Kim et al.
7,656,745 B2 2/2010 Kwak
8,358,161 B2 1/2013 Hwang
8,499,175 B2 7/2013 Song
(Continued)

FOREIGN PATENT DOCUMENTS

JP 2011146123 A 7/2011
KR 20120033512 A 4/2012
KR 20140081288 A 7/2014

*Primary Examiner* — Ly D Pham

(74) *Attorney, Agent, or Firm* — Wolf, Greenfield & Sacks, P.C.

(57) ABSTRACT

Provided is a memory device including a chip select (CS) buffer that is configured to output a first internal chip selection signal, a command clock (CK) buffer that is configured to output an internal clock signal, a command/address (CA) buffer that that is configured to output a first internal command/address signal, a CA buffer controller configured to control on/off of the CA buffer based on the first internal chip selection signal, synchronize the first internal chip selection signal and the first internal command/address signal to the internal clock signal, and delay the phase of a second internal chip selection signal synchronized to the internal clock signal, and a command decoder configured to decode any one of the second internal chip selection signal, a phase-delayed third internal chip selection signal, and/or a second internal command/address signal synchronized with the internal clock signal.

20 Claims, 13 Drawing Sheets

(56) References Cited

U.S. PATENT DOCUMENTS

| | | | | |
|---|---|---|---|---|
| 10,559,340 | B2 | 2/2020 | Kim et al. | |
| 11,227,643 | B1 * | 1/2022 | Kim | G11C 7/1066 |
| 11,322,186 | B2 | 5/2022 | Kim | |
| 11,380,383 | B2 | 7/2022 | Kim et al. | |
| 2009/0049455 | A1 * | 2/2009 | Ito | G06F 1/3203 714/763 |
| 2009/0323436 | A1 * | 12/2009 | Lee | G11C 11/406 365/189.11 |
| 2014/0181567 | A1 | 6/2014 | Choi et al. | |
| 2018/0122486 | A1 * | 5/2018 | Choi | G11C 29/028 |
| 2020/0211618 | A1 * | 7/2020 | Kwak | G11C 7/1093 |

* cited by examiner

Figure 4:
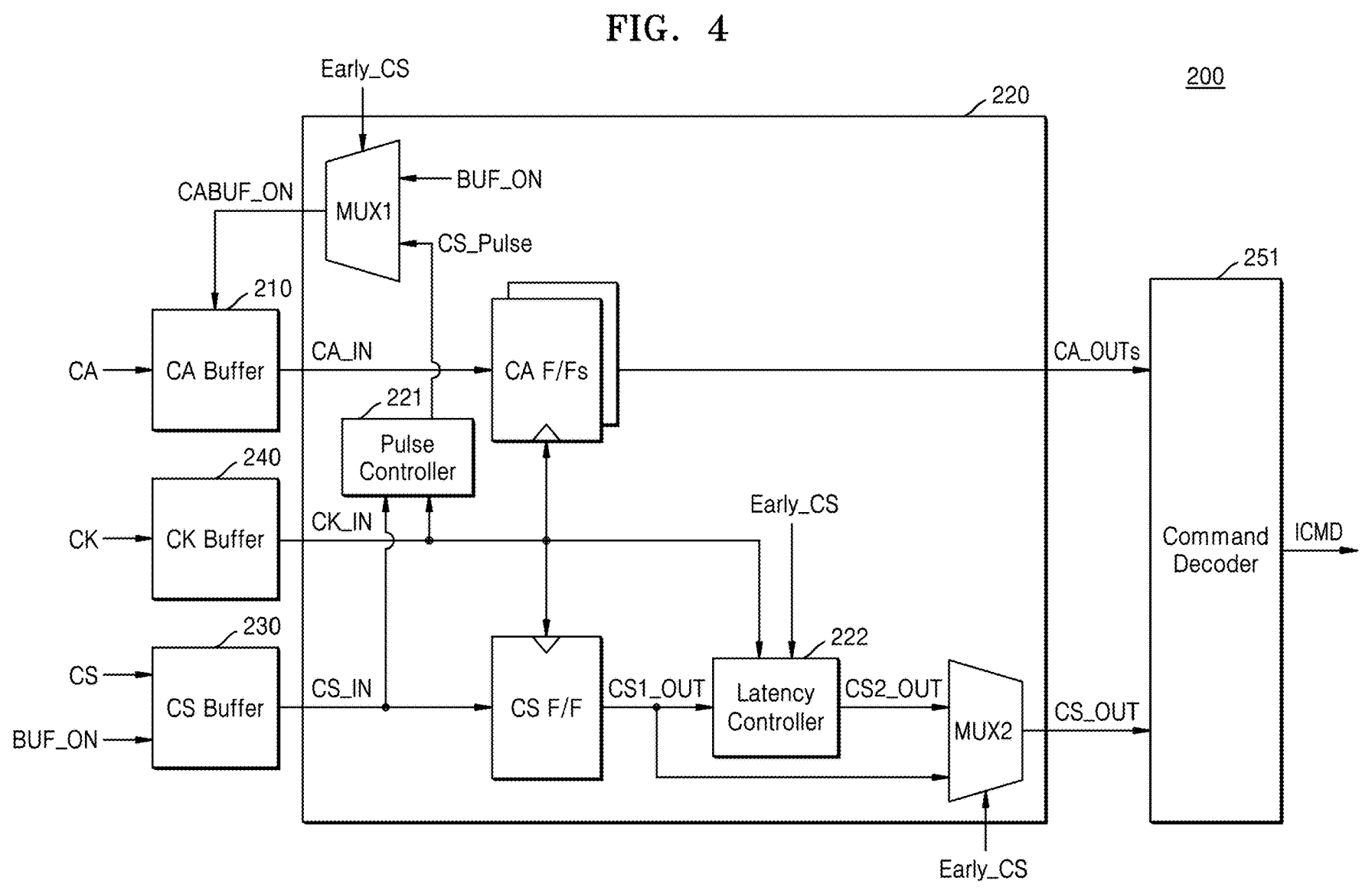

CA
CK
CS
BUF_ON
CA Buffer
210
CK Buffer
240
CS Buffer
230
CABUF_ON
220
Early_CS
MUX1
BUF_ON
CS_Pulse
CA_IN
CK_IN
CS_IN
221
Pulse Controller
CA F/Fs
CS F/F
CS1_OUT
Early_CS
222
Latency Controller
CS2_OUT
MUX2
Early_CS
CA_OUTs
CS_OUT
251
Command Decoder
ICMD

FIG. 9

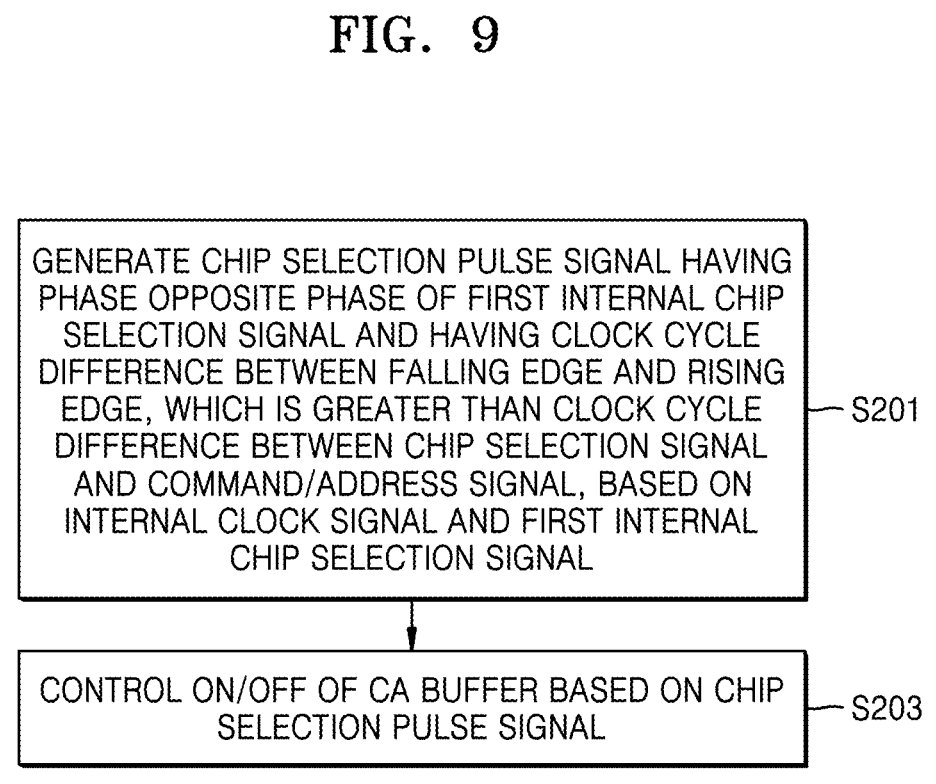

GENERATE CHIP SELECTION PULSE SIGNAL HAVING PHASE OPPOSITE PHASE OF FIRST INTERNAL CHIP SELECTION SIGNAL AND HAVING CLOCK CYCLE DIFFERENCE BETWEEN FALLING EDGE AND RISING EDGE, WHICH IS GREATER THAN CLOCK CYCLE DIFFERENCE BETWEEN CHIP SELECTION SIGNAL AND COMMAND/ADDRESS SIGNAL, BASED ON INTERNAL CLOCK SIGNAL AND FIRST INTERNAL CHIP SELECTION SIGNAL — S201

CONTROL ON/OFF OF CA BUFFER BASED ON CHIP SELECTION PULSE SIGNAL — S203

MEMORY DEVICE AND METHOD OF OPERATING THE SAME

CROSS-REFERENCE TO RELATED APPLICATION

This application is based on and claims priority under 35 U.S.C. § 119 to Korean Patent Application No. 10-2024-0010996, filed on Jan. 24, 2024, in the Korean Intellectual Property Office, the disclosure of which is incorporated by reference herein in its entirety.

BACKGROUND

The inventive concept relates to a memory device and a method of operating the same.

Semiconductor memory devices widely used in high-performance electronic systems are increasing in capacity and speed. As an example of a memory device, a dynamic random access memory (DRAM) is a volatile memory that determines data by a charge stored in a capacitor. The memory device may communicate with a memory controller by interfacing according to various standards.

The DRAM may have states such as a standby state, a refresh state, a write state, a precharge state, and the like. Methods and devices may be needed to reduce the power loss of the DRAM during the standby period.

SUMMARY

The inventive concept provides a memory device and a method of operating the same, to reduce a standby current loss in the memory device.

According to some embodiments of the inventive concept, there is provided a memory device including a chip selection (CS) buffer configured to receive a chip selection signal and output a first internal chip selection signal, a clock (CK) signal buffer configured to receive a clock signal and output an internal clock signal, a command/address (CA) buffer configured to receive a command/address signal and output a first internal command/address signal, a CA buffer controller configured to control on/off of the CA buffer based on the first internal chip selection signal, synchronize the first internal chip selection signal and the first internal command/address signal to the internal clock signal, and delay a phase of a second internal chip selection signal synchronized to the internal clock signal, and a command decoder configured to decode a phase-delayed third internal chip selection signal and a second internal command/address signal to synchronize with the internal clock signal, and generate an internal command.

According to some embodiments of the inventive concept, there is provided a method of operating a memory device including a command/address (CA) buffer, the method including receiving a chip selection signal, generating a first internal chip selection signal, receiving a clock signal, and generating an internal clock signal, receiving a command/address signal and generating a first internal command/address signal, controlling an on/off of the CA buffer based on the first internal chip selection signal, synchronizing each of the first internal chip selection signal and the first internal command/address signal with the internal clock signal, delaying a phase of a second internal chip selection signal synchronized with the internal clock signal, and decoding any one of the second internal chip selection signal and a phase-delayed third internal chip selection signal and a second internal command/address signal that is synchronized with the internal clock signal, and generating an internal command.

According to some embodiments of the inventive concept, there is provided a memory device including a chip selection (CS) buffer that is configured to receive a chip selection signal and output a first internal chip selection signal, a clock (CK) signal buffer that is configured to receive a clock signal and output an internal clock signal, a command/address (CA) buffer that is configured to receive a command/address signal and output a first internal command/address signal, a flip-flop that is configured to receive the internal clock signal and the first internal chip selection signal and output a second internal chip selection signal that is synchronized with the internal clock signal, one or more flip-flops configured to receive the internal clock signal and the first internal command/address signal and output a second internal command/address signal that is synchronized with the internal clock signal, a pulse controller configured to generate a chip selection pulse signal based on the internal clock signal and the first internal chip selection signal, a latency controller configured to generate a third internal chip selection signal by delaying a phase of the second internal chip selection signal, a first multiplexer (MUX) that is configured to output the chip selection pulse signal and/or a buffer activation signal to the CA buffer based on an early CS mode, a second MUX that is configured to output the second internal chip selection signal and/or the third internal chip selection signal based on the early CS mode, and a command decoder configured to decode a signal output by the second MUX and the second internal command/address signal and generate an internal command. In the early CS mode, the command/address signal is configured to be received after a plurality of clock cycles after the chip selection signal is received, and the phase of the third internal chip selection signal coincides with the phase of the second internal command/address signal.

BRIEF DESCRIPTION OF THE DRAWINGS

Embodiments of the inventive concept will be more clearly understood from the following detailed description taken in conjunction with the accompanying drawings in which:

FIG. 4 is a block diagram illustrating a memory device according to some embodiments;

FIGS. 8 to 11 are flowcharts illustrating methods of operating a memory device according to some embodiments.

DETAILED DESCRIPTION

Hereinafter, various embodiments of the inventive concept will be described with reference to accompanying drawings.

Figure 1:
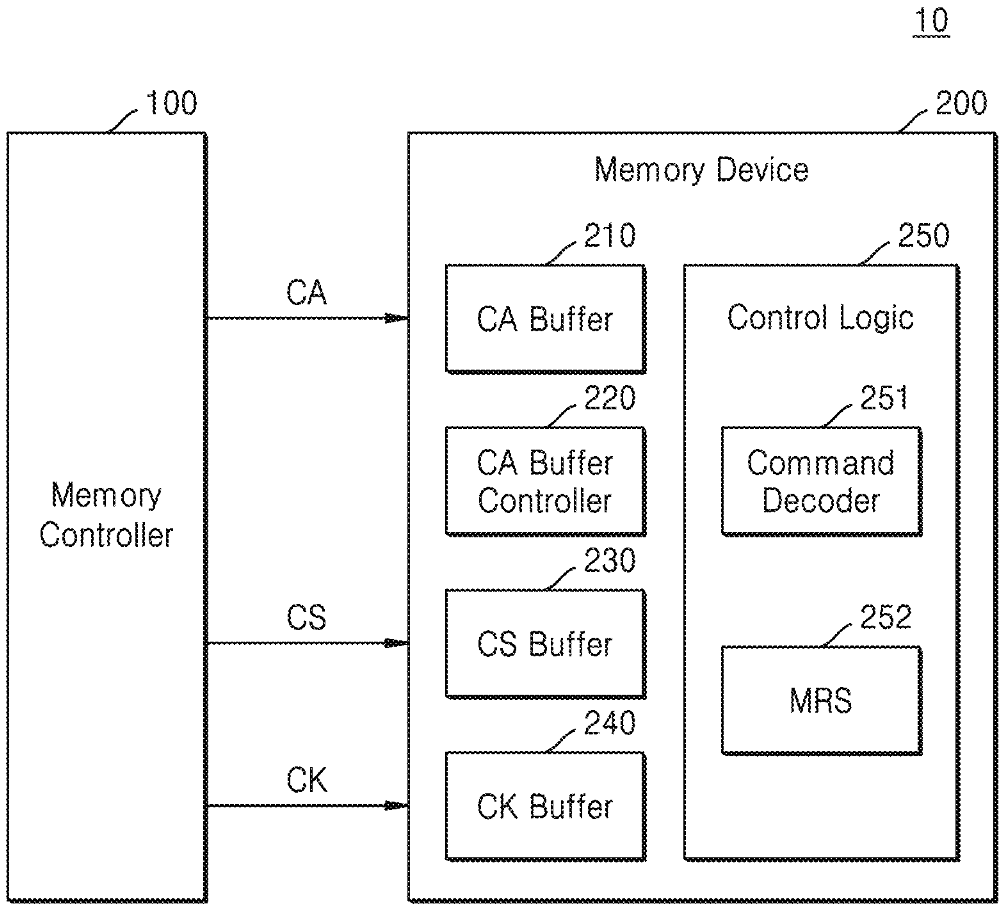
FIG. 1 is a block diagram of a memory system according to some embodiments.

FIG. 1 is a block diagram of a memory system according to some embodiments.

Referring to FIG. 1, a memory system 10 may include a memory controller 100 and a memory device 200. The memory system 10 may refer to an integrated circuit, an electronic device or system, a computing device, such as a smart phone, a tablet personal computer (PC), a computer, a server, a workstation, a portable communication terminal, a personal digital assistant (PDA), a portable multimedia player (PMP), and other suitable computers, a virtual machine or a virtual computing device thereof. In some embodiments, the memory system 10 may include some of components included in a computing system such as a graphics card. According to some embodiments, the memory system 10 may be implemented as an Unbuffered Dual In-Line Memory Module (UDIMM), a Registered DIMM (RDIMM), a Load Reduced DIMM (LRDIMM), a Fully Buffered DIMM (FBDIMM), a Small Outline DIMM (SODIMM), or the like.

In some embodiments, the memory controller 100 may be a system-on-chip (SoC) or may be included in a SoC. The SOC is an integrated circuit in which multiple components or multiple intellectual properties (IPs) of an electronic system are integrated.

The memory device 200 may write data therein or read data therefrom under the control of the memory controller 100. The memory device 200 may include a command/address (CA) buffer 210, a CA buffer controller 220, a CS buffer 230, a CK buffer 240, and a control logic 250. The control logic 250 may include a command decoder 251 and a mode register set (MRS). The memory device 200 may further include a component that functions as a memory. For example, the memory device 200 may include a memory cell array. The memory cell array may include a plurality of word lines, a plurality of bit lines, and a plurality of memory cells formed at points where the word lines and the bit lines intersect. The memory cells in the memory cell array may be volatile memory cells (e.g., dynamic random access memory (DRAM) cells, static RAM (SRAM) cells, etc.), nonvolatile memory cells (e.g., flash memory cells, Resistive RAM (ReRAM) cells, Phase Change RAM (PRAM) cells, Magnetic RAM (MRAM) cells, or any other type of memory cells.

The memory device 200 may receive a CA signal, a CK signal, and/or a CS signal from the memory controller 100. The memory device 200 may operate based on the received CK signal.

The command decoder 251 may decode the sampled CA signal and the sampled CS signal. Accordingly, the command decoder 251 may generate control signals corresponding to the CA signal.

The MRS 252 may be configured to store or manage various pieces of information used for the memory device 200 to operate. The MRS 252 may include a register that stores parameter codes for various operation and control parameters used to set operating conditions of the memory device 200. The MRS 252 may be programmed to set a plurality of operating parameters, options, various functions, characteristics, and/or modes of operation of the memory device 200. The MRS 252 may store a parameter code composed of appropriate bit values provided to a CA bus when an MRS command is issued from the memory controller 100. For example, the MRS 252 may be used to control burst length, read/write latency, preamble/postamble length, write leveling enable/disable, decision feedback equalization (hereinafter referred to as DFE) quantity, pull-down/On Die Termination (ODT) and pull-up/output high level voltage (Voh) calibration, pre-emphasis, reference voltage setting, and the like.

In addition, the MRS 252 may be used to control DRAM-associated delay locked loop (DLL) reset, DLL enable/disable, output drive strength, additive latency, termination data strobe (TDQS) enable/disable, input/output buffer enable/disable, column address strobe (CAS) write latency, dynamic termination, write cyclic redundancy check (CRC), Multi Purpose Register (MPR) location function, MPR operation function, gear down mode, MPR read format, power down mode, Vref monitoring, read preamble training mode, write preamble function, CA parity function, CRC error status, CA parity status, ODT function, data mask function, write data bus inversion (DBI) function, read DBI function, error detection code (EDC) hold pattern, etc. Although FIG. 1 illustrates that the MRS 252 is included in the control logic 250, the MRS 252 may be located outside the control logic 250, in some embodiments.

The control logic 250 may receive the CK signal and control the operation timing of the memory device 200. The operation timing of the memory device 200 may be provided based on a signal provided to the memory device 200, for example, a strobe signal, in addition to the CK signal. The control logic 250 may receive a command received through the CA bus and generate control signals for performing various memory operations in the memory device 200 in response to the command.

The memory device 200 according to some embodiments may control the on/off of the CA buffer 210 based on any one of a buffer activation signal and/or a CS signal. For example, when the memory device 200 operates in an early CS mode, the memory device 200 may control on/off of the CA buffer 210 based on the CS signal. As another example, when the memory device 200 operates in a state in which the early CS mode is released, the memory device 200 may control on/off of the CA buffer 210 based on the buffer activation signal. The early CS mode refers to a mode in which the memory device 200 receives the CS signal one or more clock cycles before the CA signal. That is, the memory device 200 may receive the delayed CA signal. For example, the memory device 200 may receive the CS signal four clock cycles before the CA signal. In the early CS mode, the memory device 200 may turn off the CA buffer 210 after receiving a command corresponding to the CA signal using the CS signal. Accordingly, during the standby period, the memory device 200 may reduce the standby current of the CA buffer 210. The buffer activation signal may activate the CA buffer 210 and the CS buffer 230. When the memory device 200 operates in an early CS mode, the memory device 200 may enable the phase of the CS signal to coincide with the phase of the CA signal by delaying the phase of the CS signal. Accordingly, the memory device 200 may decode the CS signal and the CA signal. Depending on the situation, the memory device 200 may request the memory controller 100 to enter an early CS mode.

The control logic 250 according to some embodiments may control the early CS mode by using the MRS 252. The control logic 250 may receive the MRW command for starting or ending the early CS mode received from the memory controller 100 and provide the early CS mode signal to the CA buffer controller 220.

The memory device 200 according to some embodiments may reduce a time at which the CA buffer 210 is activated during the standby period.

The memory device 200 according to some embodiments may reduce current and power loss of the CA buffer 210 during the standby period.

Figure 2:
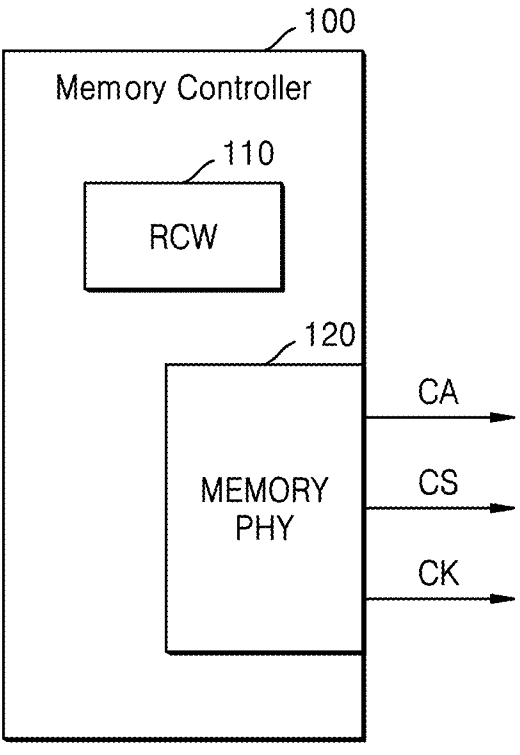
FIG. 2 is a block diagram of a memory controller according to some embodiments.

FIG. 2 is a block diagram of a memory controller according to some embodiments. FIG. 2 may be described with reference to FIG. 1, and redundant descriptions may be omitted.

Referring to FIG. 2, a memory controller 100 may include a register control word (RCW) 110 (hereinafter, referred to as RCW) and a memory physical interface (PHY) 120. The memory controller 100 may be communicatively connected to the memory device 200 through a memory bus.

The RCW 110 may be provided to perform control according to initialization and/or operation characteristics of the memory device 200. The RCW 110 may include various algorithms for configuring the memory controller 100 so that the memory controller 100 may normally interact with the memory device 200. For example, codes representing the frequency, timing, driving, and detailed operation parameters of the memory device 200 may be configured in the RCW 110. Memory training of the memory device 200 may be performed according to a code of the RCW 110.

The memory PHY 120 may include a physical or electrical layer and a logical layer provided for signals, frequency, timing, driving, detailed operation parameters, and functionality needed for efficient communication between the memory controller 100 and the memory device 200. The memory PHY 120 may support features of the Double Data Rate (DDR) and/or Low Power DDR (LPDDR) protocol of the Joint Electron Device Engineering Council (JEDEC) standard.

The memory PHY 120 may connect the memory controller 100 with the memory device 200 through a memory bus. Although the CK signal, the CS signal, and the CS signal are provided through one signal line between the memory controller 100 and the memory device 200 for simplicity of the drawing, the CK, CA and CS signals may be provided through a plurality of signal lines or buses. Signal lines between the memory controller 100 and the memory device 200 may be connected through connectors. The connectors may be implemented as pins, balls, signal lines, or other hardware components.

The CK signal may be transmitted from the memory controller 100 to the memory device 200 through a clock signal line of the memory bus. The CA signal may be transmitted from the memory controller 100 to the memory device 200 through a CA bus of the memory bus. The CS signal may be transmitted from the memory controller 100 to the memory device 200 through a CS line of the memory bus. The CS signal activated to a logic high may indicate that the CA signal transmitted through the CA bus is a command. In addition, data may be transmitted from the memory controller 100 to the memory device 200 or from the memory device 200 to the memory controller 100 through a data bus of a memory bus including bidirectional signal lines.

According to some embodiments, the memory controller 100 may transmit a mode register write (MRW) command for starting the early CS mode to the memory device 200 through the CA bus. In addition, the memory controller 100 may transmit the CS signal to the memory device 200 and transmit the CA signal to the memory device 200 after multiple clock cycles have elapsed.

Figure 3:
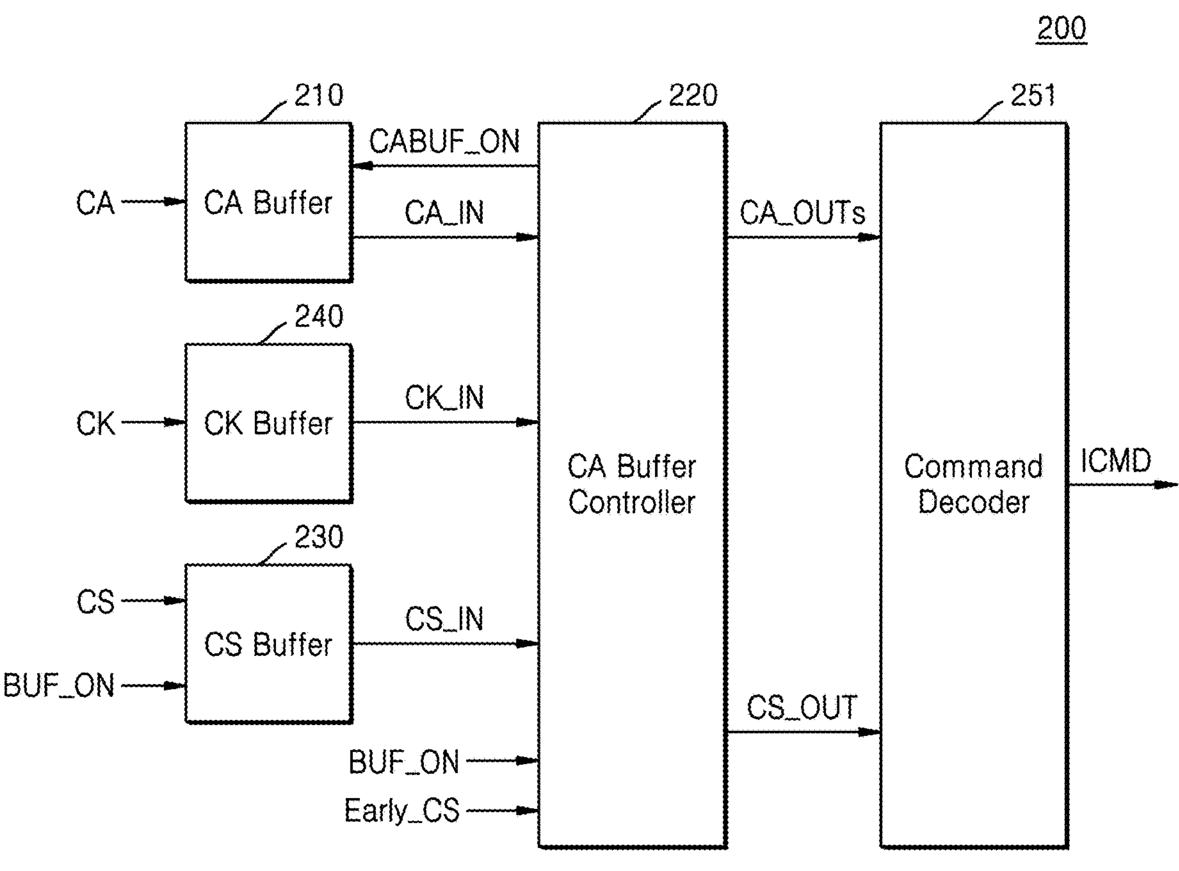
FIG. 3 is a block diagram illustrating a memory device according to some embodiments.

FIG. 3 is a block diagram illustrating a memory device according to some embodiments. FIG. 3 may be described with reference to FIGS. 1 and 2.

Referring to FIG. 3, the memory device 200 may include a CA buffer 210, a CA buffer controller 220, a CS buffer 230, a CK buffer 240, and a command decoder 251.

The memory device 200 may receive a CA signal, a CK signal, and a CS signal from the memory controller 100. For example, the CA buffer 210 may receive a CA signal from the memory controller 100. The CS buffer 230 may receive a CK signal from the memory controller 100. The CK buffer 240 may receive a CK signal from the memory controller 100.

The CS buffer 230 may receive the CS signal and output a first internal CS signal CS_IN. For example, the CS buffer 230 may output the first internal CS signal CS_IN obtained by amplifying the CS signal.

The CK buffer 240 may receive the CK signal and output an internal CK signal CK_IN. For example, the CK buffer 240 may output the internal CK signal CK_IN obtained by amplifying the CK signal.

The CA buffer 210 may receive the CA signal and output a first internal CA signal CA_IN. For example, the CA buffer 210 may output the first internal CA signal CA_IN obtained by amplifying the CA signal.

When the CA buffer controller 220 operates in the early CS mode, the reception of the CA signal may be performed after a plurality of clock cycles after reception of the chip select signal CS. For example, after the CA buffer controller 220 receives a MRW command to start the early CS mode from the memory controller 100, the CA buffer controller 220 may receive the CS signal from the memory controller 100 and receive the CA signal after a plurality of clocks from the CS reception.

The CA buffer controller 220 may control on/off of the CA buffer 210 based on a CA buffer activation signal CABUF_ON. For example, the CA buffer controller 220 may control on/off of the CA buffer 210 based on one of a buffer activation signal BUF_ON and/or the first internal CS signal CS_IN. According to some embodiments, the buffer activation signal BUF_ON may operate as the CA buffer activation signal CABUF_ON, and a signal based on the first internal CS signal CS_IN may operate as the CA buffer activation signal CABUF_ON. When operating in the early CS mode, the CA buffer controller 220 may control on/off of the CA buffer 210 based on the first internal CS signal CS_IN. When not operating in the early CS mode, the CA buffer controller 220 may control on/off of the CA buffer 210 based on the buffer activation signal BUF_ON. The buffer activation signal BUF_ON may activate the CA buffer 210 and the CS buffer 230. According to some embodiments, the buffer activation signal BUF_ON may turn on the CA buffer and the CS buffer at a logic low level. According to some embodiments, the buffer activation signal BUF_ON may turn on the CA buffer and the CS buffer at a logic high level, and is not limited to the embodiments described above.

In other words, the CA buffer controller 220 may control on/off of the CA buffer 210 based on one of a buffer activation signal BUF_ON and/or the first internal CS signal CS_IN. According to some embodiments, the CA buffer controller 220 may generate a chip selection pulse signal CS_PULSE having a phase opposite that of the first internal CS signal CS_IN based on the internal CK signal CK_IN and the first internal CS signal CS_IN, and having a clock cycle difference between a falling edge and a rising edge, which is greater than the clock cycle difference between the CS signal and the CA signal. In addition, the CA buffer controller 220 may control the on/off of the CA buffer 210 based on one of the buffer activation signal BUF_ON and the CS pulse signal CS_PULSE.

When operating in the early CS mode, the CA buffer controller 220 may control on/off of the CA buffer 210 based on the chip selection pulse signal. When not operating in the early CS mode, the CA buffer controller 220 may control on/off of the CA buffer 210 based on the buffer activation signal BUF_ON. For example, the CA buffer controller 220 may control on/off of the CA buffer 210 based on the CS pulse signal CS_PULSE when receiving an MRW command for starting the early CS mode from the memory controller 100, and may control on/off of the CA buffer 210 based on the buffer activation signal BUF_ON when receiving an MRW command for ending the early CS mode from the memory controller 100. When the logic level of the buffer activation signal BUF_ON or the CS pulse signal CS_PULSE is a logic low level, the CA buffer 210 is turned on, and when the logic level of the buffer activation signal BUF_ON or the CS pulse signal CS_PULSE is a logic high level, the CA buffer 210 may be turned off.

The CA buffer controller 220 may synchronize the first internal CS signal CS_IN and the first internal CA signal CA_IN with the internal CK signal CK_IN, respectively. The CA buffer controller 220 may delay the phase of a second internal CS signal. The second internal chip selection signal is the first internal CS signal CS_IN synchronized with the internal CK signal CK_IN. The CA buffer controller 220 may delay the phase of the second internal CS signal. Accordingly, the CA buffer controller 220 may match the phase of the second internal CS signal to the phase of the second internal CA signals CA_OUTs. The second internal CA signals CA_OUTs are the first internal CA signal CA_IN synchronized with the internal CK signal CK_IN. The CA buffer controller 220 may generate a third internal CS signal by delaying the phase of the second internal CS signal. The CA buffer controller 220 may input one output signal CS_OUT of the second internal CS signal and the third internal CS signal to the command decoder 251.

When the CA buffer controller 220 operates in the early CS mode, the CA buffer controller 220 may input a third internal CS signal to the command decoder 251 as the output signal CS_OUT. For example, when the CA buffer controller 220 receives an MRW command for starting the early CS mode from the memory controller 100, the third internal CS signal CS2_OUT and the second internal CA signals CA_OUTs may be input to the command decoder 251.

When the CA buffer controller 220 does not operate in the early CS mode, the CA buffer controller 220 may input the second internal CS signal to the command decoder 251 as the output signal CS_OUT. For example, when receiving an MRW command for ending the early CS mode, the CA buffer controller 220 may input the second internal CS signal CS2_OUT and the second internal CA signals CA_OUTs to the command decoder 251.

Accordingly, the command decoder 251 may decode CS_OUT of the second internal CS signal, the third internal CS signal, and/or the second internal CA signals CA_OUTs, and generate an internal command ICMD.

The control logic 250 may provide the early CS mode signal Early_CS to the CA buffer controller 220. In addition, when the early CS mode ends and the control logic 250 receives at least one of a power down command and/or a self-refresh command, the control logic 250 may turn off at least one of the CA buffer 210 and the CS buffer 230 through the buffer activation signal BUF_ON.

FIG. 4 is a block diagram illustrating a memory device according to some embodiments. FIG. 4 may be described with reference to FIG. 3, and redundant descriptions may be omitted.

Referring to FIG. 4, a memory device 200 may include D flip-flops CS F/F and CA F/Fs, a pulse controller 221, a latency controller 222, a first MUX MUX1, and a second MUX MUX2. The D flip-flop CS F/F may receive the internal CK signal CK_IN and the first internal CS signal CS_IN and output the second internal CS signal CS1_OUT synchronized with the internal CK signal CK_IN.

The D flip-flops CA F/Fs may receive the internal CK signal CK_IN and the first internal CA signal CA_IN and output the second internal CA signals CA_OUTs synchronized with the internal CK signal CK_IN. The D flip-flops CA F/Fs may include a plurality of D flip-flops.

The pulse controller 221 may generate a CS pulse signal CS_PULSE based on the internal CK signal CK_IN and the first internal CS signal CS_IN.

The latency controller 222 may delay the phase of the second internal CS signal CS1_OUT. The latency controller 222 may receive the second internal CS signal CS1_OUT and output the third internal CS signal CS2_OUT.

The first MUX MUX1 may output any one of the CS pulse signal CS_PULSE and/or the buffer activation signal BUF_ON to the CA buffer 210 as the CA buffer activation signal CABUF_ON based on the early CS mode.

The second MUX MUX2 may output any one of a second internal CS signal CS1_OUT and/or a third internal CS signal CS2_OUT based on the early CS mode.

The command decoder 251 may decode the signal CS_OUT output by the second MUX MUX2 and the second internal CA signals CA_OUTs, and generate the internal command ICMD.

The early CS mode is a mode in which reception of the CA signal is performed after a plurality of clock cycles after reception of the CS signal. The phase of the third internal CS signal CS2_OUT may coincide with the phases of the second internal CA signals CA_OUTs.

Figure 5:
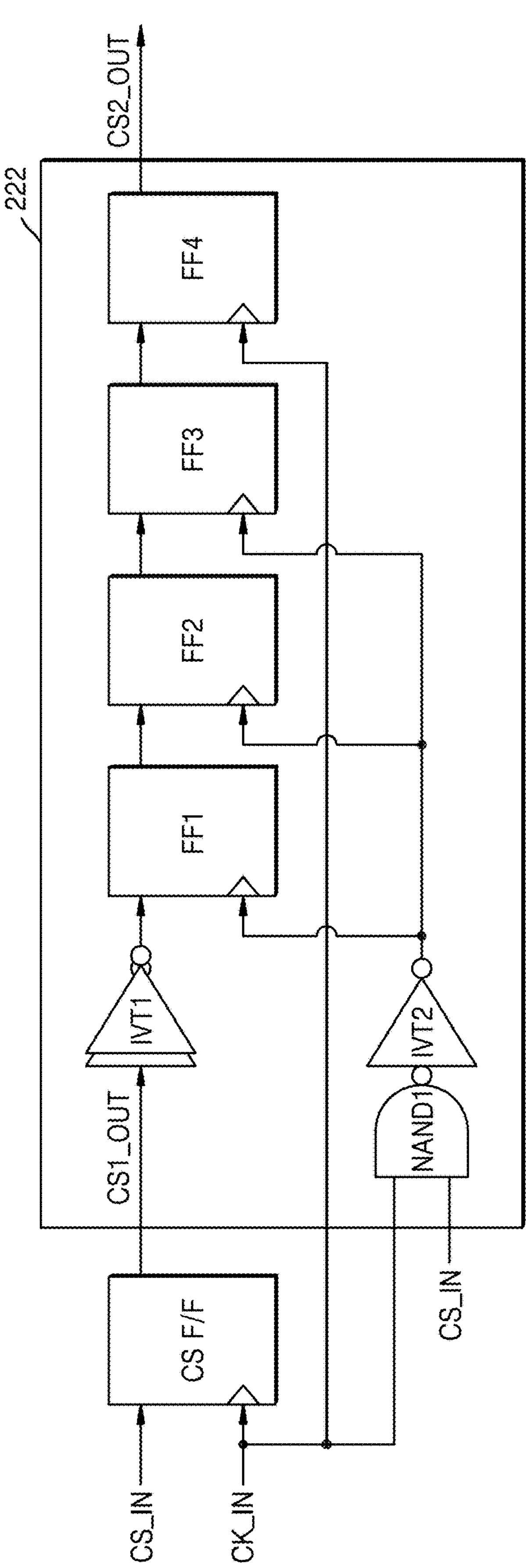
FIG. 5 is a block diagram illustrating a latency controller according to some embodiments.

FIG. 5 is a block diagram illustrating a latency controller according to some embodiments. FIG. 5 may be described with reference to FIG. 4, and redundant descriptions may be omitted.

Referring to FIG. 5, the latency controller 222 may include inverters IVT1 and IVT2, a NAND gate NAND1, and D flip-flops FF1, FF2, FF3, and FF4. The NAND gate NAND1 may receive an early CS mode signal Early_CS and an internal CK signal CK_IN. The output signal of the NAND gate NAND1 may be inverted through the inverter IVT2, and the inverted signal may be input to the D flip-flops FF1, FF2, and FF3. The D flip-flop FF1 may receive an inverted second internal CS signal CS1_OUT through the inverter IVT1. The D flip-flop FF2 may receive the output signal of the D flip-flop FF1. The D flip-flop FF3 may receive the output signal of the D flip-flop FF2. The D flip-flop FF4 may receive the output signal of the D flip-flop FF3 and output the delayed second internal CS signal CS1_OUT, that is, the third internal CS signal CS2_OUT.

Figure 6A:
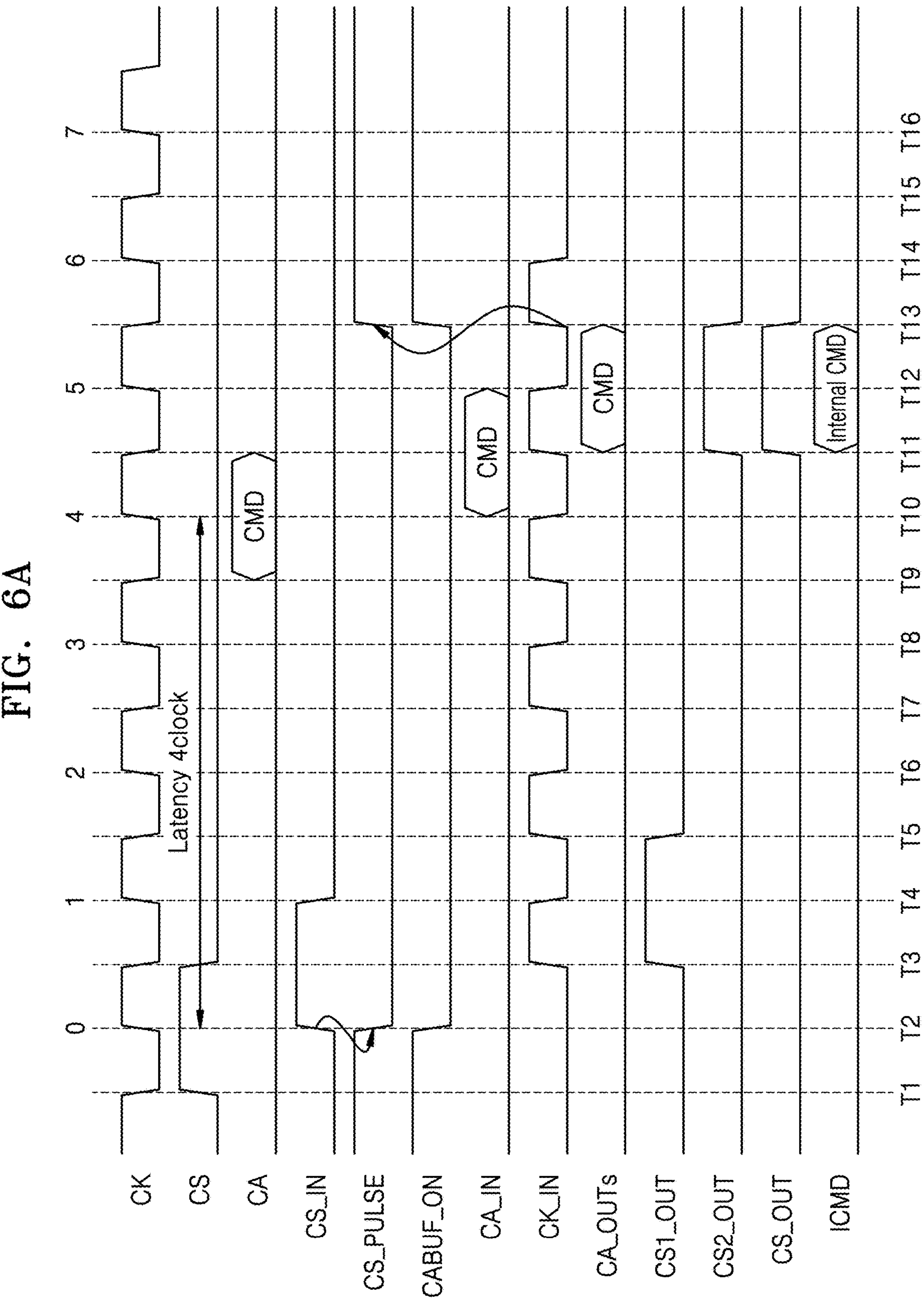
FIGS. 6A and 6B illustrate operation timing diagrams of a memory device according to some embodiments.
Figure 6B:
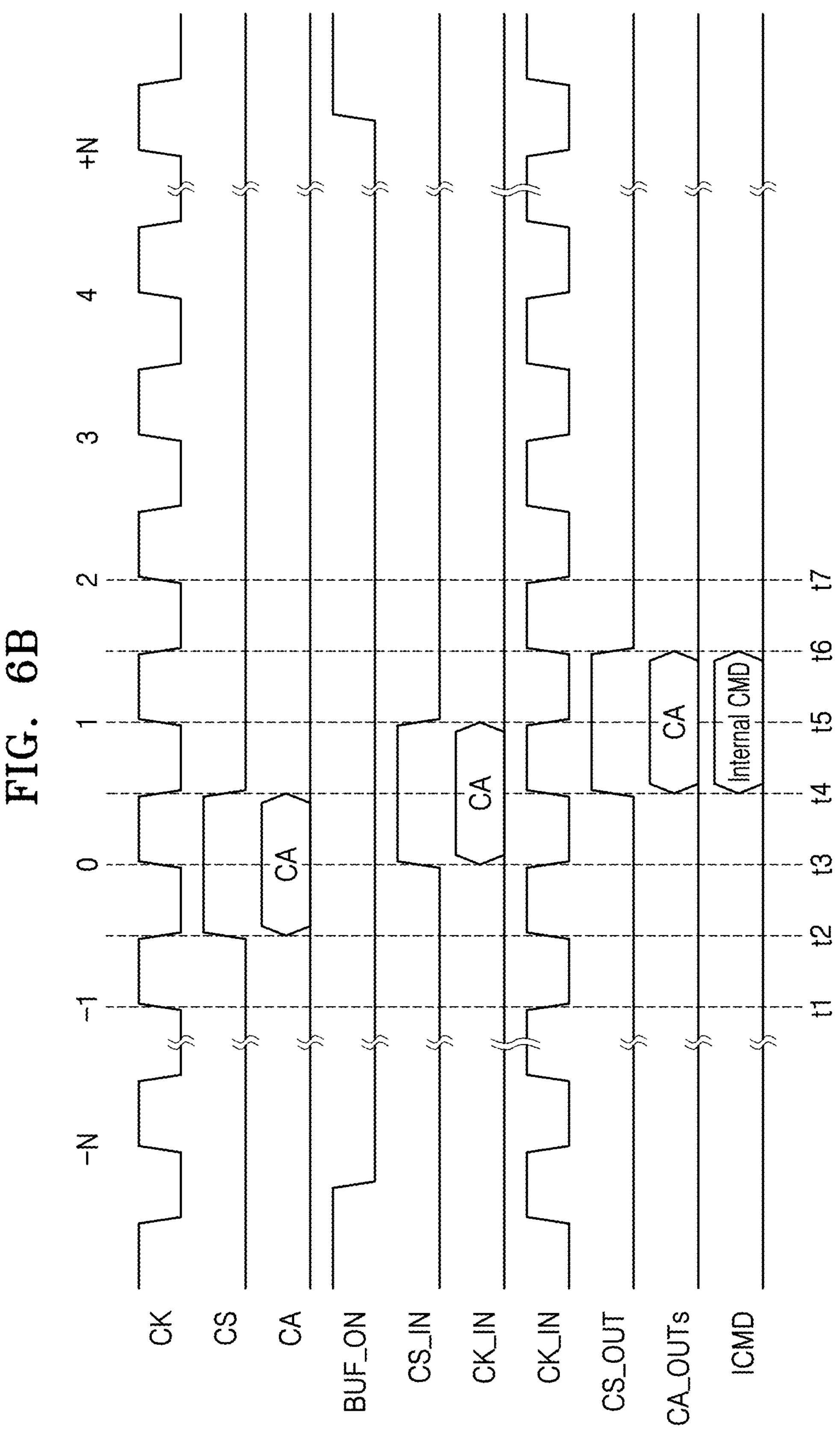

FIGS. 6A and 6B illustrate operation timing diagrams of a memory device according to some embodiments. FIGS. 6A and 6B may be described with reference to FIG. 4, and redundant descriptions may be omitted. FIG. 6A assumes that the memory device 200 operates in a state in which the early CS mode is started. FIG. 6B assumes that the memory device 200 operates in a state in which the early CS mode is ended.

FIGS. 6A and 6B schematically illustrate timing of a CK signal, a CS signal, a CA signal, a first internal CA signal CA_IN, a first internal CS signal CS_IN, a CS pulse signal CS_PULSE, a CA buffer activation signal CABUF_ON, a first internal CA signal CA_IN, an internal CK signal CK_IN, a second internal CA signal CA_OUTs, a second internal CS signal CS1_OUT, a third internal CS signal CS2_OUT, an output signal CS_OUT of a second MUX MUX2, an internal command ICMD, and a buffer activation signal BUF_ON.

Referring to FIG. 6A, the memory device 200 may generate a CS pulse signal CS_PULSE having a phase opposite the phase of the rising edge of the first internal CS signal CS_IN at a timing T2. For example, the pulse controller 221 may generate a CS pulse signal CS_PULSE having a phase opposite the phase of the rising edge of the first internal CS signal CS_IN at a timing T2. In addition, the memory device 200 may generate a CS pulse signal CS_PULSE in which the clock cycle difference between the falling edge and the rising edge is greater than the clock cycle difference between the CS signal and the CA signal.

Referring to FIG. 6A, a clock cycle difference between the CS signal and the CA signal equals 4 clock cycles, which may correspond to an interval between the timing T2 and the timing T10. A clock cycle difference between a falling edge and a rising edge of the CS pulse signal CS_PULSE equals 5 clock cycles, which may correspond to an interval between the timing T2 and the timing T13. A clock cycle difference between a falling edge and a rising edge of the CS pulse signal CS_PULSE may be referred to as a pulse width. The clock cycle difference between the CS signal and the CA signal is not limited to 4 clock cycles, and the pulse width of the CS pulse signal CS_PULSE is not limited to 5 clock cycles, as FIG. 6A represents a non-limiting example.

According to some embodiments, the memory device 200 may set the pulse width of the CS pulse signal CS_PULSE to be greater than the clock cycle difference between the CS signal and the CA signal. According to some embodiments, the memory device 200 may set the pulse width of the CS pulse signal CS_PULSE to be less than the pulse width of the buffer activation signal BUF_ON when the early CS mode is ended. According to some embodiments, the memory device 200 may control the pulse width of the CS pulse signal CS_PULSE so that the CA buffer 210 is turned off after the memory device 200 receives a command CMD of the second internal CA signal CA_OUTs.

Referring to FIG. 6A, in the early CS mode, the first MUX MUX1 selects the CS pulse signal CS_PULSE from the CS pulse signal CS_PULSE and the buffer activation signal BUF_ON, so that the CA buffer activation signal CABUF_ON may be input to the CA buffer 210. That is, in the early CS mode, the CS pulse signal CS_PULSE is the same as the CA buffer activation signal CABUF_ON. In a section (from the timing T2 to the timing T13) in which the CA buffer activation signal CABUF_ON is in a logic low level, the CA buffer 210 may be activated. After the timing T13, the CA buffer 210 is turned off. Accordingly, the memory device 200 may reduce the current and power of the CA buffer 210.

Referring to FIG. 6A, the memory device 200 may generate a third internal CS signal CS2_OUT by delaying the phase of the second internal CS signal CS1_OUT.

The phase of the third internal CS signal CS2_OUT may coincide with the phases of the second internal CA signals CA_OUTs. Accordingly, the command decoder 251 may decode the CS signal and the CA signal having different phases from each other.

Referring to FIG. 6B, when the early CS mode is ended, the memory device 200 may receive a CS signal and a CA signal at the same timing T2. A buffer activation signal BUF_ON may be input to the CA buffer 210 and the CS buffer 230. When the memory device 200 receives at least one of a power down command and a self-refresh command, at least one of the CA buffer 210 and the CS buffer 230 may be turned off through the buffer activation signal BUF_ON. That is, when the memory device 200 receives at least one of the power down command and the self-refresh command, the buffer activation signal BUF_ON may transition from a logic low level to a logic high level.

Figure 7A:
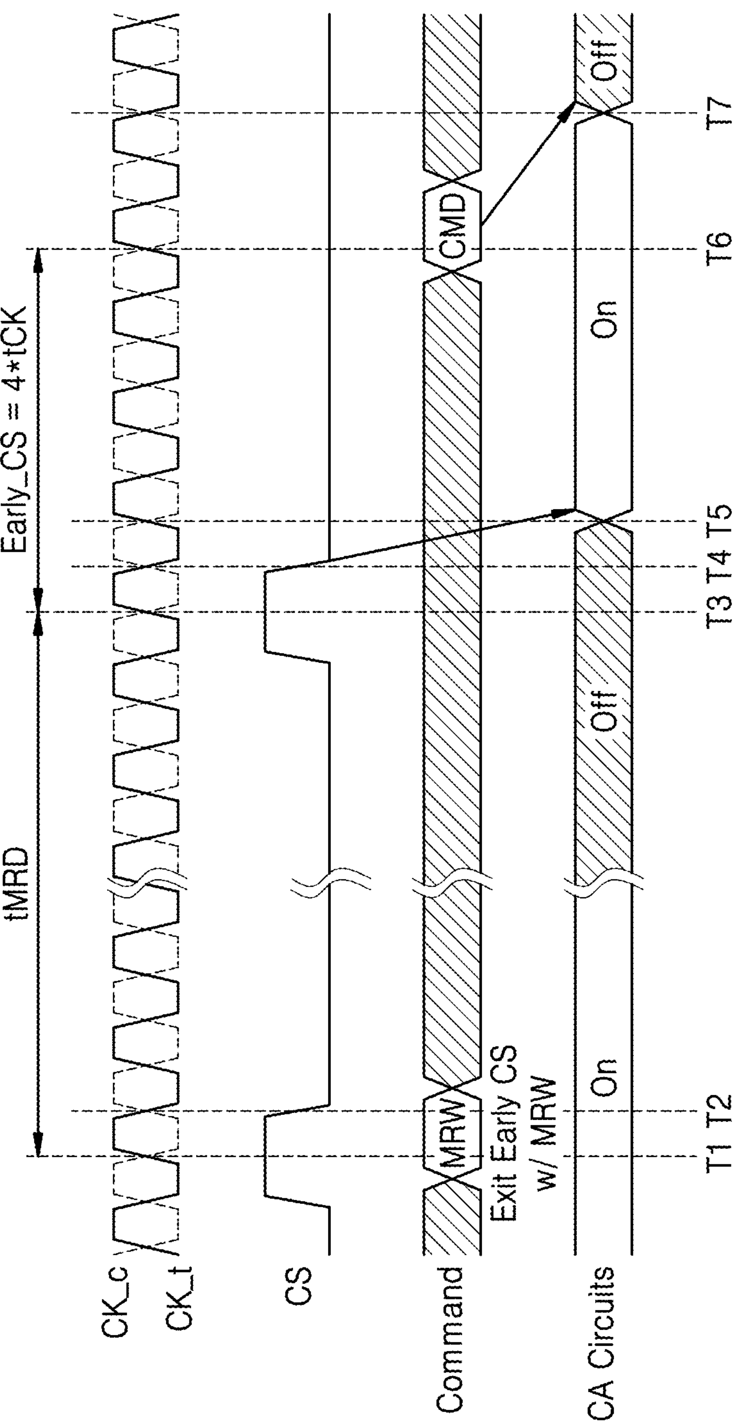
FIGS. 7A and 7B illustrate operation timing diagrams of a memory system according to some embodiments.
Figure 7B:
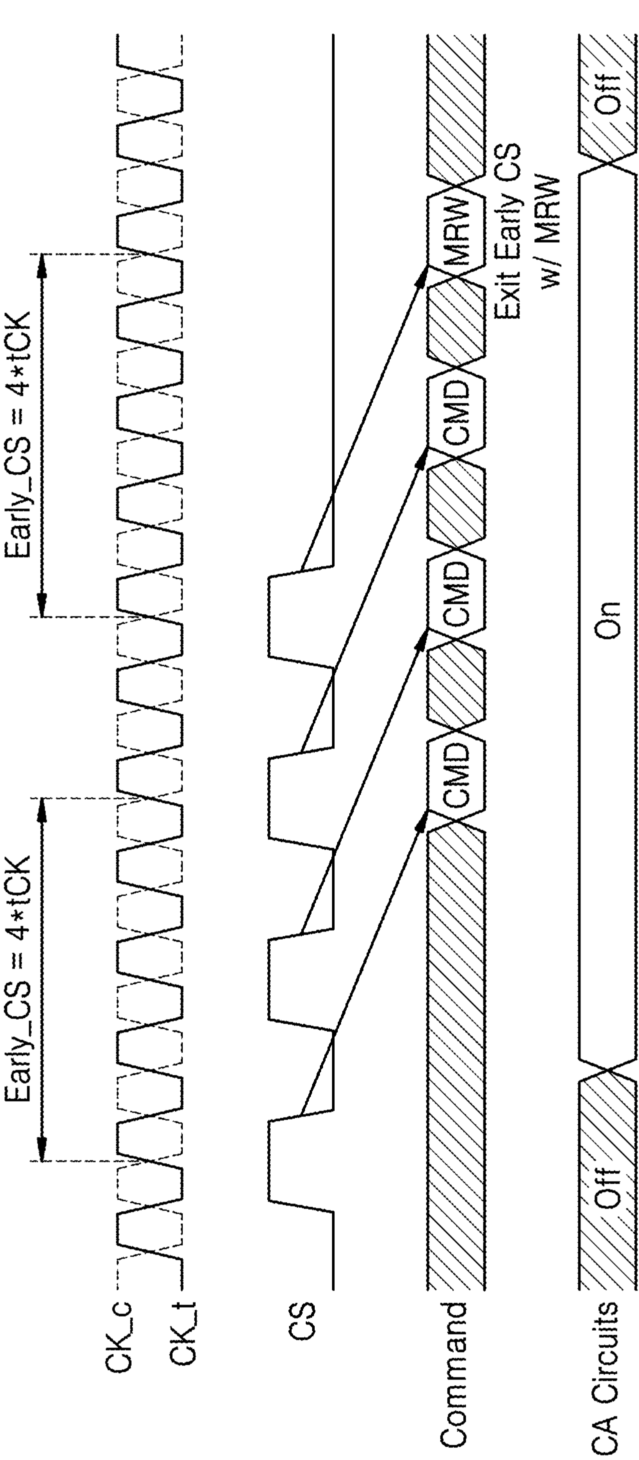

FIGS. 7A and 7B illustrate operation timing diagrams of a memory system according to some embodiments. FIGS. 7A to 7B may be described with reference to FIGS. 1 and 4, and redundant descriptions may be omitted.

Referring to FIG. 7A, the memory device 200 according to some embodiments may receive an MRW command for early CS start at timing T2 from the memory controller 100 through a command/address line. The CA circuits may include the CA buffer 210. The memory device 200 may receive an MRW command for early CS start and the early CS mode may be continued. For example, the memory device 200 may continue the early CS mode during a mode register delay tMRD. The memory device 200 may receive the CS signal at the timing T3, and receive the command CMD at the timing T6 after 4 clock cycles 4*Tck from reception of the CS signal. The memory device 200 may turn off the CA circuits (e.g., the CA buffer 210) up to the timing T5, and may turn on the CA circuits after receiving the CS signal CS. Also, the memory device 200 may turn off the CA circuits from the timing T7 after receiving the command CMD.

Referring to FIG. 7B, the memory device 200 may receive a plurality of CS signals. In addition, the memory device 200 may receive commands CMD corresponding to the received plurality of CS signals. The CA circuits may be turned on while the memory device 200 receives the plurality of commands CMD. After the memory device 200 receives the MRW command for ending the early CS mode, the CA circuits may be turned off.

Figure 8:
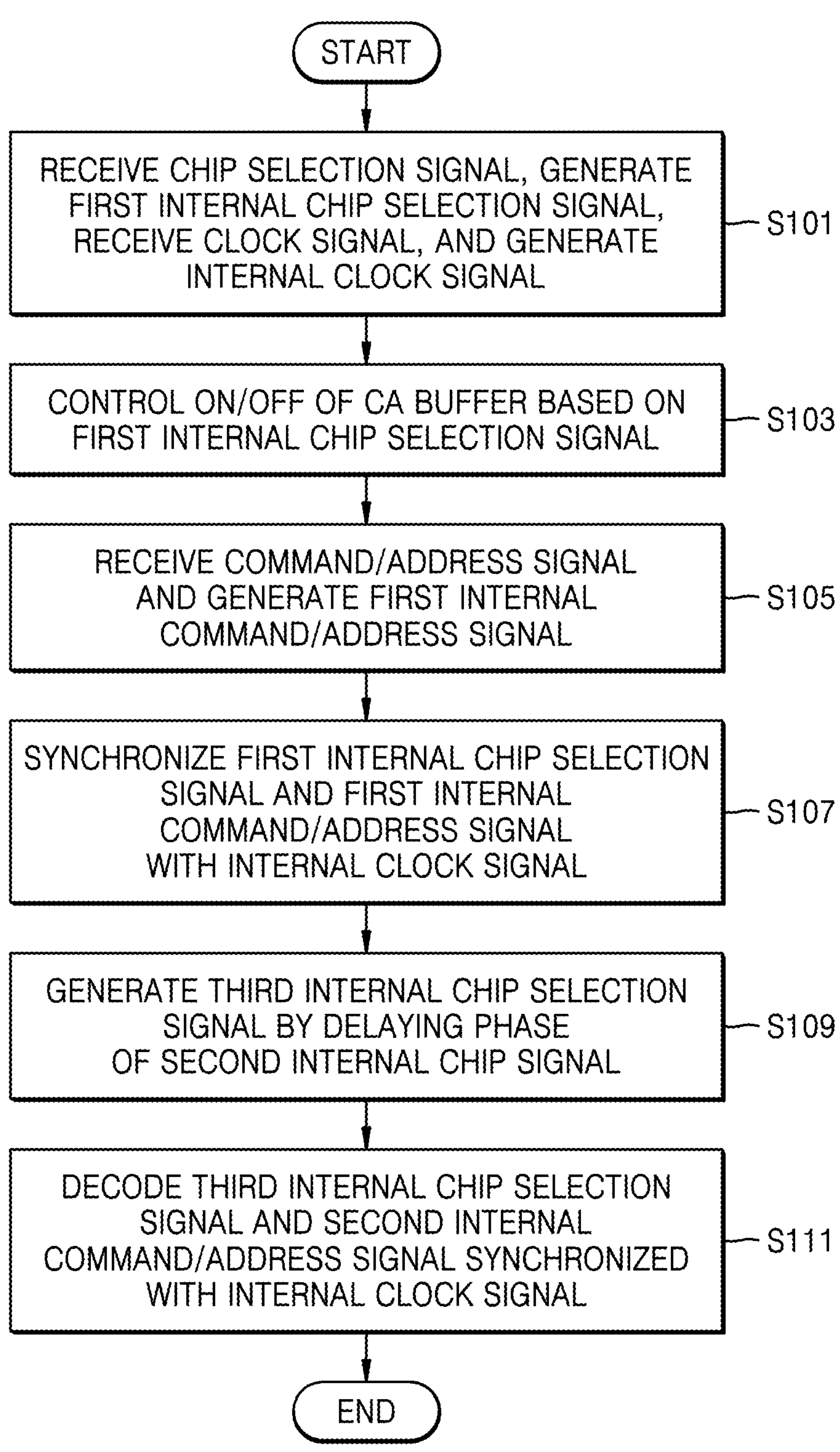

FIGS. 8 and 9 are flowcharts illustrating a method of operating a memory device according to some embodiments. FIGS. 8 to 9 may be described with reference to FIGS. 1 and 4, and redundant descriptions may be omitted.

Referring to FIG. 8, in operation S101, the memory device 200 may receive a CS signal, generate a first internal CS signal, receive a CK signal, and generate an internal CK signal.

In operation S103, the memory device 200 may control on/off of the CA buffer 210 based on the first internal CS signal. Referring to FIG. 9, in operation S201, the memory device 200 may generate a CS pulse signal having a phase opposite the phase of the first internal CS signal based on the internal CK signal and the first internal CS signal, and having a clock cycle difference between a falling edge and a rising edge of the CS pulse signal CS_PULSE greater than a clock cycle difference between the CS signal and the CA signal. In operation S203 of FIG. 9, the memory device 200 may control on/off of the CA buffer 210 based on the CS pulse signal. For example, when the memory device 200 receives an MRW command for starting the early CS mode, the CA buffer 210 may be turned on/off based on the CS pulse signal. According to some embodiments, when the memory device 200 receives an MRW command for ending the early CS mode, the CA buffer 210 may be turned on and off based on the buffer activation signal.

Referring back to FIG. 8, in operation S105, the memory device 200 may receive a CA signal and generate a first internal CA signal. The memory device 200 in the early CS mode may receive the CS signal and receive the CA signal after a plurality of clocks from the CS signal reception. For example, when the memory device 200 receives an MRW command for starting the early CS mode, the memory device 200 may receive the CS signal and receive the CA signal after a plurality of clocks from the CS signal reception. For example, a clock cycle difference between the CS signal and the CA signal may equal 4 clock cycles. In addition, the clock cycle difference between the falling edge and the rising edge of the CS pulse signal may equal 5 clock cycles or more. The clock cycle difference between the CS signal and the CA signal and the pulse width of the CS pulse signal are not limited to the embodiments described above.

In operation S107, the memory device 200 may synchronize each of the first internal CS signal and the first internal CA signal with the internal CK signal.

In operation S109, the memory device 200 may generate a third internal CS signal by delaying the phase of the second internal CS signal.

In operation S111, the memory device 200 may decode the third internal CS signal and the second internal CA signal synchronized with the internal CK signal. The phase of the third internal CS signal may coincide with the phase of the second internal CA signal. For example, the CA buffer controller 220 may receive a buffer activation signal from the memory controller 100. When the CA buffer controller 220 receives an MRW command for ending the early CS mode from the memory controller 100, the CA buffer controller 220 may be configured to control on/off of the CA buffer 210 based on the buffer activation signal. The command decoder 251 may decode the second internal CS signal and the second internal CA signal synchronized with the internal CK signal.

Figure 10:
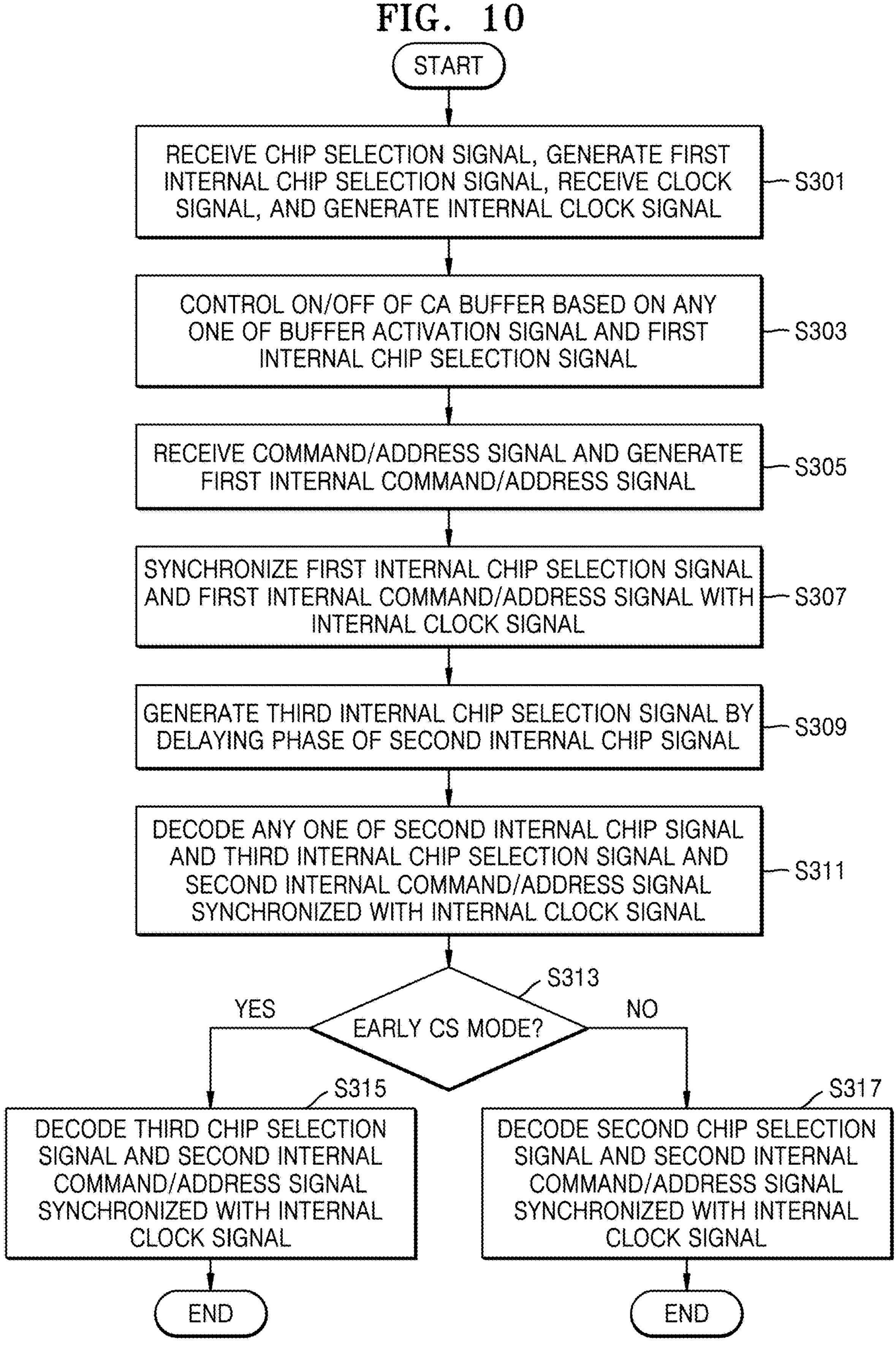
Figure 11:
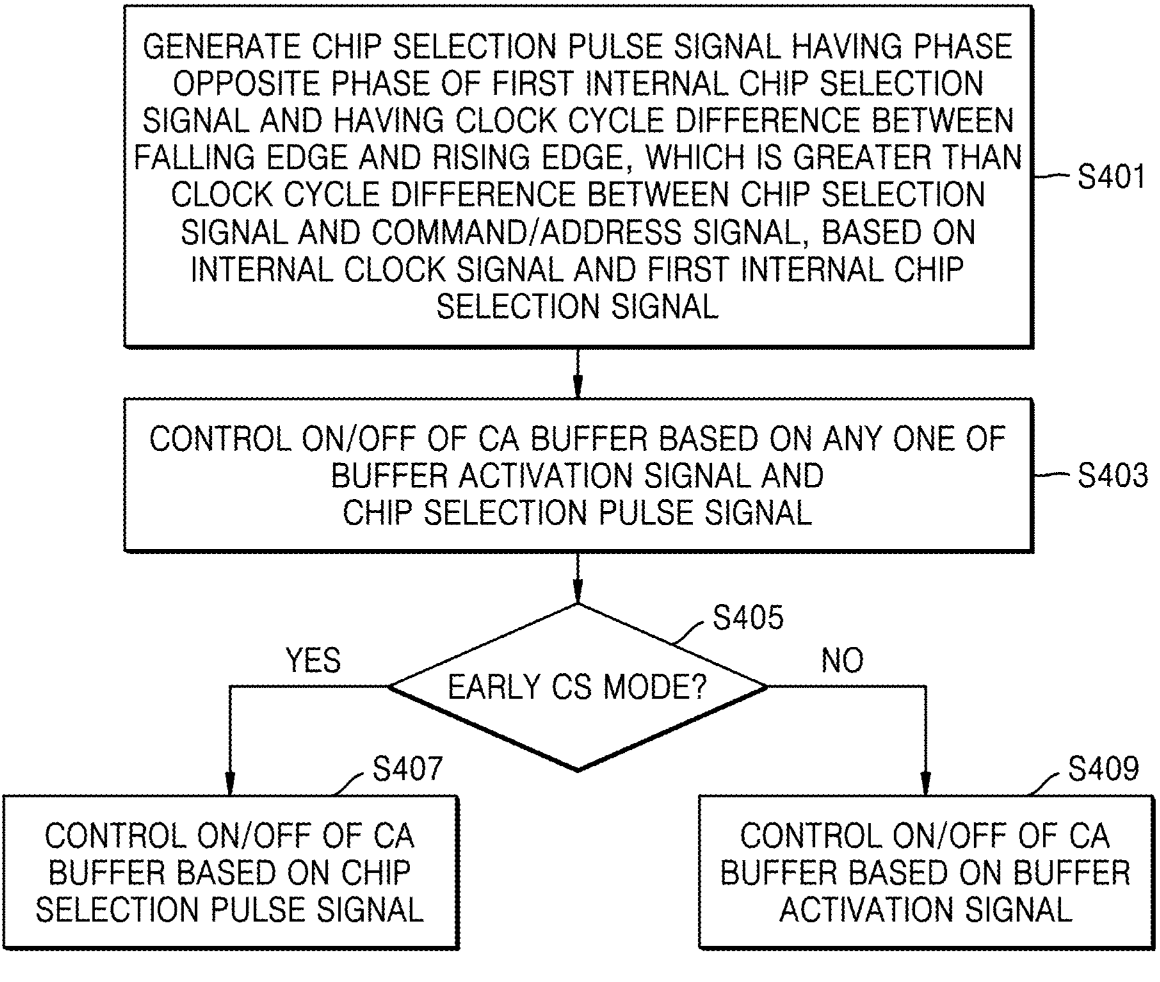

FIGS. 10 and 11 are flowcharts illustrating a method of operating a memory device according to some embodiments. FIGS. 10 to 11 may be described with reference to FIGS. 1 and 4, and redundant descriptions may be omitted.

Referring to FIG. 10, in operation S301, the memory device 200 may receive a CS signal, generate a first internal CS signal, receive a CK signal, and generate an internal CK signal.

In operation S303, the memory device 200 may control on/off of the CA buffer 210 based on any one of the buffer activation signal and/or the first internal CS signal. Referring to FIG. 11, in operation S401, the memory device 200 may generate a CS pulse signal having a phase opposite the phase of the first internal CS signal based on the internal CK signal and the first internal CS signal, and having a clock cycle difference between a falling edge and a rising edge of the CS pulse signal CS_PULSE greater than a clock cycle difference between the CS signal and the CA signal. In operation S403, the memory device 200 may control on/off of the CA buffer 210 based on any one of a buffer activation signal and/or a CS pulse signal. In operations S405 and S407, the memory device 200 may control on/off of the CA buffer based on the CS pulse signal in the early CS mode. For example, when the memory device 200 receives an MRW command for starting the early CS mode, the CA buffer 210 may be turned on/off based on the CS pulse signal. In operations S205 and S209, the memory device 200 may control on/off of the CA buffer based on the buffer activation signal in the state not in the early CS mode. For example, when the memory device 200 receives an MRW command for ending the early CS mode, the CA buffer 210 may be turned on and off based on the buffer activation signal.

Referring back to FIG. 10, in operation S305, the memory device 200 may receive a CA signal and generate a first internal CA signal. The memory device 200 in the early CS mode may receive the CS signal and then receive the CA signal after a plurality of clocks from the CS signal reception. For example, when the memory device 200 receives an MRW command for starting the early CS mode, the CA signal may be received a plurality of clock cycles after the CS signal. For example, a clock cycle difference between the CS signal and the CA signal may equal 4 clock cycles. In addition, the clock cycle difference between the falling edge and the rising edge of the CS pulse signal may equal 5 clock cycles or more. The clock cycle difference between the CS signal and the CA signal and the pulse width of the CS pulse signal are not limited to the embodiments described above.

In operation S307, the memory device 200 may synchronize each of the first internal CS signal and the first internal CA signal with the internal CK signal.

In operation S309, the memory device 200 may generate a third internal CS signal by delaying the phase of the second internal CS signal.

In operation S311, the memory device 200 may decode any one of the second internal CS signal, the third internal CS signal, and/or the second internal CA signal synchronized with the internal CK signal.

In operations S313 and S315, the memory device 200 may decode the third internal CS signal and the second internal CA signal synchronized with the internal CK signal. In the early CS mode, the phase of the third internal CS signal may coincide with the phase of the second internal CA signal.

In operations S313 and S317, the second internal CS signal and the second internal CA signal synchronized with the internal CK signal may be decoded. When the early CS mode is ended, the phase of the second internal CS signal may coincide with the phase of the second internal CA signal.

The term "and/or" includes any and all combinations of one or more of the associated listed items. It will be understood that, although the terms first, second, third, etc. may be used herein to describe various elements, and elements should not be limited by these terms; rather, these terms are only used to distinguish one element from another element. Thus, a first element discussed could be termed a second element without departing from the scope of the present inventive concepts.

While the inventive concept has been particularly shown and described with reference to embodiments thereof, it will be understood that various changes in form and details may be made therein without departing from the spirit and scope of the following claims.

What is claimed is:

1. A memory device comprising:

a chip selection (CS) buffer configured to receive a chip selection signal and output a first internal chip selection signal;

a clock (CK) signal buffer configured to receive a clock signal and output an internal clock signal;

a command/address (CA) buffer configured to receive a command/address signal and output a first internal command/address signal;

a CA buffer controller configured to control on/off of the CA buffer based on the first internal chip selection signal, synchronize the first internal chip selection signal and the first internal command/address signal to the internal clock signal, and delay a phase of a second internal chip selection signal to synchronize to the internal clock signal; and a command decoder configured to decode a phase-delayed third internal chip selection signal and a second internal command/address signal that is synchronized with the internal clock signal, and configured to generate an internal command.

2. The memory device of claim 1, wherein, when the CA buffer controller receives a mode register write (MRW) command for starting an early CS mode, the CA buffer is configured to receive the command/address signal after a plurality of clock cycles after the chip selection signal has been received.

3. The memory device of claim 1, wherein the CA buffer controller is further configured to, based on the internal clock signal and the first internal chip selection signal, generate a chip selection pulse signal having a phase opposite that of the first internal chip selection signal and having a clock cycle difference between a falling edge and a rising edge that is greater than a clock cycle difference between the chip selection signal and the command/address signal, and wherein the CA buffer controller is further configured to control the on/off of the CA buffer based on the chip selection pulse signal.

4. The memory device of claim 3, wherein the CA buffer controller is configured to control the on/off of the CA buffer based on the chip selection pulse signal when a mode register write (MRW) command for starting an early CS mode has been received.

5. The memory device of claim 1, wherein the CA buffer controller is configured to: receive a buffer activation signal; and when a mode register write (MRW) command for ending an early CS mode is received, control the on/off of the CA buffer based on the buffer activation signal, and wherein the command decoder is configured to decode the second internal chip selection signal and the second internal command/address signal that is synchronized with the internal clock signal.

6. The memory device of claim 3, wherein the CA buffer is configured to be activated when a logic level of the chip selection pulse signal is a logic low level and turned off when the logic level of the chip selection pulse signal is a logic high level.

7. The memory device of claim 3, wherein a clock cycle difference between the chip selection signal and the command/address signal is 4 clock cycles, and a clock cycle difference between the falling edge and the rising edge of the chip selection pulse signal is 5 clock cycles or more.

8. The memory device of claim 1, wherein a phase of the phase-delayed third internal chip selection signal coincides with a phase of the second internal command/address signal.

9. The memory device of claim 1, wherein the CA buffer controller is further configured to input the phase-delayed third internal chip selection signal and the second internal command/address signal to the command decoder when a mode register write (MRW) command for starting an early CS mode is received.

10. The memory device of claim 1, wherein the CA buffer controller is further configured to input the second internal chip selection signal and the second internal command/address signal to the command decoder when a mode register write (MRW) command for ending an early CS mode is received.

11. A method of operating a memory device including a command/address (CA) buffer, the method comprising:

receiving a chip selection signal, generating a first internal chip selection signal, receiving a clock signal, and generating an internal clock signal;

receiving a command/address signal and generating a first internal command/address signal;

controlling an on/off of the CA buffer based on the first internal chip selection signal;

synchronizing each of the first internal chip selection signal and the first internal command/address signal with the internal clock signal;

delaying a phase of a second internal chip selection signal that is synchronized with the internal clock signal; and decoding a phase-delayed third internal chip selection signal and a second internal command/address signal that is synchronized with the internal clock signal, and generating an internal command.

12. The method of claim 11, further comprising:

receiving a mode register write (MRW) command for starting an early chip selection (CS) mode, wherein, in the early CS mode, the command/address signal is received after a plurality of clock cycles after a chip select signal is received.

13. The method of claim 11, wherein the controlling of the on/off of the CA buffer comprises:

based on the internal clock signal and the first internal chip selection signal, generating a chip selection pulse signal having a phase opposite that of the first internal chip selection signal and having a clock cycle difference between a falling edge and a rising edge that is greater than a clock cycle difference between the chip selection signal and the command/address signal; and controlling the on/off of the CA buffer based on the chip selection pulse signal.

14. The method of claim 13, wherein the controlling of the on/off of the CA buffer based on the chip selection pulse signal comprises controlling the on/off of the CA buffer based on the chip selection pulse signal when a mode register write (MRW) command for starting an early chip selection (CS) mode has been received.

15. The method of claim 11, further comprising:

receiving a buffer activation signal; and controlling the on/off of the CA buffer based on the buffer activation signal when a mode register write (MRW) command for ending an early chip selection (CS) mode has been received.

16. The method of claim 13, wherein a clock cycle difference between the chip selection signal and the command/address signal is 4 clock cycles, and a clock cycle difference between the falling edge and the rising edge of the chip selection pulse signal is 5 clock cycles or more.

17. The method of claim 11, wherein a phase of the phase-delayed third internal chip selection signal coincides with a phase of the second internal command/address signal.

18. The method of claim 11, wherein the decoding of the phase-delayed third internal chip selection signal and the second internal command/address signal that is synchronized with the internal clock signal, and the generating of the internal command comprise:

decoding the phase-delayed third internal chip selection signal and the second internal command/address signal when a mode register write (MRW) command for starting an early chip selection (CS) mode has been received.

19. The method of claim 11, further comprising:

decoding the second internal chip selection signal and the second internal command/address signal when a mode register write (MRW) command for ending an early chip selection (CS) mode has been received.

20. A memory device comprising:

a chip select (CS) buffer that is configured to receive a chip selection signal and output a first internal chip selection signal;

a command clock (CK) buffer that is configured to receive a clock signal and output an internal clock signal;

a command/address (CA) buffer that is configured to receive a command/address signal and output a first internal command/address signal;

a flip-flop that is configured to receive the internal clock signal and the first internal chip selection signal and output a second internal chip selection signal that is synchronized with the internal clock signal;

one or more flip-flops configured to receive the internal clock signal and the first internal command/address signal and output a second internal command/address signal that is synchronized with the internal clock signal;

a pulse controller configured to generate a chip selection pulse signal based on the internal clock signal and the first internal chip selection signal;

a latency controller configured to generate a third internal chip selection signal by delaying a phase of the second internal chip selection signal;

a first multiplexer (MUX) that is configured to output the chip selection pulse signal and/or a buffer activation signal to the CA buffer based on an early CS mode;

a second MUX that is configured to output the second internal chip selection signal and/or the third internal chip selection signal based on the early CS mode; and a command decoder configured to decode a signal output by the second MUX and the second internal command/address signal and generate an internal command, wherein in the early CS mode, the command/address signal is configured to be received after a plurality of clock cycles after the chip selection signal is received, and wherein the phase of the third internal chip selection signal coincides with the phase of the second internal command/address signal.

* * * * *